US012787857B2

(12) United States Patent
Liebl et al.

(10) Patent No.: US 12,787,857 B2
(45) Date of Patent: Nov. 3, 2026

(54) SEMICONDUCTOR MODULE WITH SHAPED EXTERNAL CONTACT FOR REDUCED CRACK FORMATION IN THE ENCAPSULATION BODY

(71) Applicant: Infineon Technologies AG, Neubiberg (DE)

(72) Inventors: Christoph Liebl, Munich (DE); Stefan Schwab, Regensburg (DE); Adrian Lis, Regensburg (DE); Michael Ledutke, Saal (DE); Lisa Aschenbrenner, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 1002 days.

(21) Appl. No.: 17/840,971

(22) Filed: Jun. 15, 2022

(65) Prior Publication Data

US 2022/0415732 A1 Dec. 29, 2022

(30) Foreign Application Priority Data

Jun. 24, 2021 (DE) ......................... 102021116321.8
Apr. 7, 2022 (DE) ......................... 102022108472.8

(51) Int. Cl.
*H10W 76/157* (2026.01)
*H10W 40/25* (2026.01)
(Continued)

(52) U.S. Cl.
CPC ....... *H10W 76/157* (2026.01); *H10W 40/255* (2026.01); *H10W 74/114* (2026.01)

(58) Field of Classification Search
CPC ............... H01L 23/057; H01L 23/3121; H01L 23/49541; H10W 76/157; H10W 74/114;
(Continued)

(56) References Cited

U.S. PATENT DOCUMENTS 6,150,709 A * 11/2000 Shin .................... H01L 23/3114 257/E23.047
6,211,462 B1 * 4/2001 Carter, Jr. ........... H01L 23/3107 174/532
(Continued)

FOREIGN PATENT DOCUMENTS

CN 105931972 A 9/2016
CN 110783283 A 2/2020
(Continued)

*Primary Examiner* — Joshua Benitez Rosario
*Assistant Examiner* — Jacob T Nelson
(74) *Attorney, Agent, or Firm* — Murphy, Bilak & Homiller, PLLC

(57) ABSTRACT

A semiconductor module includes: a chip carrier having a first side and a second, opposite side; a semiconductor chip arranged on the first side of the chip carrier; an encapsulation body that encapsulates the semiconductor chip; and at least two external contacts made of a metal or an alloy and arranged next to each other, which are electrically and mechanically connected to the first side of the first chip carrier and protrude laterally out of the encapsulation body. At least one of the external contacts has at least one wing arranged within the encapsulation body and located opposite the other external contact. The wing includes one or more cutouts that are filled with the encapsulation material of the encapsulation body.

20 Claims, 5 Drawing Sheets

(51) Int. Cl.

| | |
|---|---|
| ***H10W 70/40*** | (2026.01) |
| ***H10W 72/00*** | (2026.01) |
| ***H10W 74/00*** | (2026.01) |
| ***H10W 74/10*** | (2026.01) |

(58) Field of Classification Search
CPC ............. H10W 74/111; H10W 74/127; H10W 72/07354; H10W 72/347
See application file for complete search history.

(56) References Cited

U.S. PATENT DOCUMENTS

| | | | | |
|---|---|---|---|---|
| 6,476,478 | B1 | 11/2002 | Swiss et al. | |
| 2003/0214026 | A1* | 11/2003 | Tokuhara | H01L 23/13 257/692 |
| 2006/0261473 | A1 | 11/2006 | Connah et al. | |
| 2016/0284632 | A1 | 9/2016 | Shinohara et al. | |
| 2019/0206770 | A1 | 7/2019 | Anis Fauzi et al. | |

FOREIGN PATENT DOCUMENTS

| | | | |
|---|---|---|---|
| CN | 210296358 | U | 4/2020 |
| DE | 102019115857 | A1 | 12/2020 |
| JP | 2000124379 | A | 4/2000 |
| JP | 2002086487 | A | 3/2002 |
| JP | 2008124430 | A | 5/2008 |
| WO | 2018096050 | A1 | 5/2018 |

* cited by examiner

SEMICONDUCTOR MODULE WITH SHAPED EXTERNAL CONTACT FOR REDUCED CRACK FORMATION IN THE ENCAPSULATION BODY

TECHNICAL FIELD

The present disclosure relates to a semiconductor module which has an external contact with a special shape, which can, inter alia, reduce the formation of cracks in the encapsulation body.

BACKGROUND

Semiconductor modules have encapsulation bodies that are used to encapsulate and protect semiconductor chips, and external contacts that are exposed on the encapsulation body and provide electrical contact to the semiconductor chips. The dielectric material of the encapsulation bodies on one side and the metal or alloy of the external contacts or other electrically conductive components on the other side have thermal expansion coefficients which are significantly different. This can lead to the formation of cracks in the encapsulation body or the partial detachment of the encapsulation body from the external contacts (delamination) due to temperature changes, e.g. when the encapsulation material cools down after casting. This may affect the electrical insulation or mechanical protection provided by the encapsulation body and, in the worst case, the semiconductor module may become unusable. Improved semiconductor modules can help to eliminate these and other problems.

SUMMARY

Individual examples relate to a semiconductor module comprising: a chip carrier having a first side and a second, opposite side, a semiconductor chip arranged on the first side of the chip carrier, an encapsulation body that encapsulates the semiconductor chip, and at least two external contacts made of a metal or an alloy and arranged next to each other, which are electrically and mechanically connected to the first side of the chip carrier and protrude laterally from the encapsulation body, wherein at least one of the external contacts has at least one wing arranged within the encapsulation body and located opposite the other external contact, and wherein the wing comprises one or more cutouts that are filled with the encapsulation material of the encapsulation body.

Individual examples relate to a semiconductor module comprising: a chip carrier having a first side and a second, opposite side, a semiconductor chip arranged on the first side of the chip carrier, an encapsulation body that encapsulates the semiconductor chip, and at least two external contacts made of a metal or an alloy and arranged next to each other, which are electrically and mechanically connected to the first side of the chip carrier and protrude laterally from the encapsulation body, wherein at least one of the external contacts has at least one wing arranged within the encapsulation body and located opposite the other external contact, wherein the external contact parts protruding from the encapsulation body define a common plane, and wherein the wing is bent out of this plane.

Individual examples relate to a semiconductor module comprising: a first chip carrier having a first side and a second, opposite side and a second chip carrier having a first and a second, opposite side, wherein the first sides of the first and second chip carriers are facing each other, a semiconductor chip arranged between the first sides of the first and second chip carriers and arranged on the first side of the first chip carrier, an encapsulation body that encapsulates the semiconductor chip, and at least two external contacts made of a metal or an alloy and arranged next to each other, wherein one of the external contacts is electrically and mechanically connected to the first side of the first chip carrier and another of the external contacts is electrically and mechanically connected to the first side of the second chip carrier and wherein the external contacts protrude laterally from the encapsulation body, wherein at least one of the external contacts has at least one wing arranged within the encapsulation body and located opposite another of the external contacts, and wherein the wing comprises one or more cutouts that are filled with the encapsulation material of the encapsulation body.

BRIEF DESCRIPTION OF THE DRAWINGS

The attached drawings are examples and, together with the description, serve to explain the basic features of the disclosure. The elements of the drawings are not necessarily true to scale. The same reference signs may indicate corresponding, similar or identical parts.

DETAILED DESCRIPTION

Although a specific feature or a specific aspect of an example may have been disclosed in relation to only one of a plurality of implementations, such a feature or such an aspect can also be combined with one or more other features or aspects of the other implementations, as may be desired and advantageous for a given or specific application, unless specifically stated otherwise or if there is a technical constraint. If the terms “contain”, “comprise”, “with” or other variations thereof are used, either in the detailed description or in the claims, these terms shall also have an inclusive meaning in a manner similar to the term “comprise”. The terms “coupled” and “connected” can be used along with derivatives thereof. It should be clear that these terms can be used to indicate that two elements co-operate or interact with each other, regardless of whether they are in direct physical or electrical contact with each other or not; intermediate elements or layers may be provided. Furthermore, the term "exemplary" is intended to mean an example and not the best or the optimum.

The following describes arrangements that contain one or more semiconductor chips. For example, the semiconductor chips can be designed as power semiconductor chips, such as power MOSFETs (metal-oxide semiconductor field-effect transistors), IGBTs (bipolar transistors with insulated gate), JFETs (barrier layer field-effect transistors), power bipolar transistors, or power diodes. In addition, the semiconductor chips can comprise control circuits, microprocessors, etc. The semiconductor chips can comprise a specific semiconductor material such as Si, SiC, SiGe, GaAs, or GaN.

For example, efficient semiconductor modules can reduce material consumption, chemical waste, or ohmic losses, resulting in potential energy and/or resource savings. Improved semiconductor modules, such as those specified in this description, can thus contribute at least indirectly to "green technology" solutions, i.e. climate-friendly solutions that enable energy and/or resource consumption to be reduced.

Figure 1:
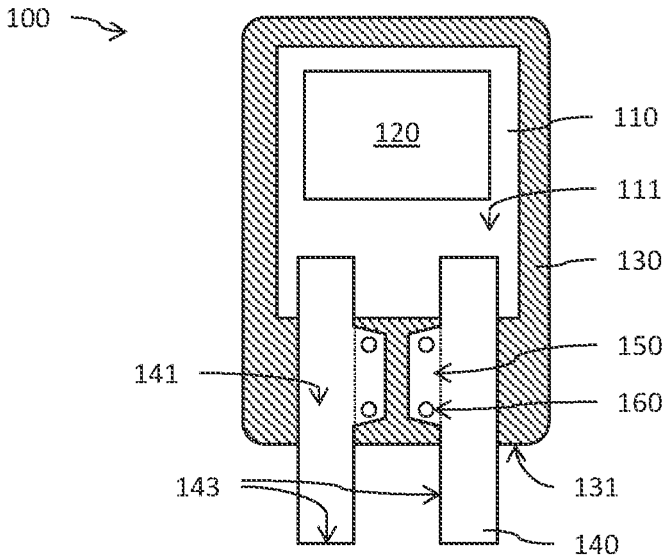
FIG. 1 shows a plan view of a semiconductor module in which external contacts have so-called wings, which comprise cutouts which in turn are filled with encapsulation material.

FIG. 1 shows a semiconductor module 100 having a chip carrier 110, a semiconductor chip 120, an encapsulation body 130 and at least two external contacts 140, wherein at least one of the external contacts 140 comprises at least one wing 150.

The chip carrier 110 comprises a first side 111 and a second, opposite side, the semiconductor chip 120 being arranged on the first side 111 and encapsulated by the encapsulation body 130. The at least two external contacts 140 are electrically and mechanically connected to the first side 111 of the chip carrier 110 and are arranged next to each other in such a way that they protrude laterally from the encapsulation body 130, e.g. from a first lateral side 131. In addition, the at least two external contacts 140 are made of a suitable metal or a suitable alloy.

At least one of the external contacts 140 has at least one wing 150, which is arranged inside the encapsulation body 130 and opposite the other external contact 140. In FIG. 1, for ease of presentation, a delimitation of the wings 150 from the rest of the external contacts 140 is indicated by dashed lines. The wing or wings 150 has/have one or more cutouts 160 which are filled with the encapsulation material of the encapsulation body.

The semiconductor module 100 can be a packaged semiconductor device. The semiconductor module 100 can be designed for surface mounting (surface mount device, SMD) or for through-hole mounting (through hole device, THD). In addition, the semiconductor module 100 can be a power semiconductor module designed for operation at a high voltage and/or with high current. The semiconductor module 100 can also be designed for double-sided cooling, with a thermal dissipation path leading upwards from the semiconductor chip 120 and an opposite thermal dissipation path leading downwards to the second side of the chip carrier 110.

The chip carrier 110 can be any suitable type of chip carrier, e.g. a chip carrier of type AMB (active metal brazing), DCB (direct copper bond), DAB (direct aluminum bond), lead frame, etc. The chip carrier 110 can in particular comprise a ceramic layer and electrically conductive layers deposited or mounted above and below the ceramic layer.

According to one example, the semiconductor module 100 can have a second chip carrier, which is located opposite the first side 111 of the chip carrier 110 in such a way that the semiconductor chip 120 and the inner portion of the external contacts 140 are located between the two chip carriers.

The semiconductor chip 120 can be mechanically and electrically coupled to the first side 111 of the chip carrier, e.g. by means of a solder joint, a sintered connection, conductive adhesive, etc. The external contacts 140 can also be mechanically and electrically coupled to the first side 111 of the chip carrier, e.g. by means of solder joints, sintered connections, conductive adhesive, etc.

The semiconductor chip 120 can be a power semiconductor chip. The external contacts 140 can each be connected to a power electrode of the semiconductor chip 120, e.g. to a source, drain, emitter, or collector electrode. The semiconductor module 100 can comprise a plurality of semiconductor chips 120 which can be electrically connected to each other in order to provide a circuit such as a half-bridge circuit, a converter, an inverter, etc. The plurality of semiconductor chips 120 can be arranged on the chip carrier 110.

The encapsulation body 130 can be a molded body, for example. According to one example, the chip carrier 110 can be at least partially uncovered by the encapsulation body. In particular, the second side of the chip carrier 110 can be uncovered by the encapsulation body 130 in order to be connected, for example, to a heat sink or a thermal conduction path in a substrate.

The external contacts 140 can be parts of a lead frame, for example. The external contacts 140 can be or consist of Al, Cu or Fe, for example. According to one example, the semiconductor module 100 may have additional external contacts, which can be power contacts and/or measurement contacts and/or control contacts.

The external contacts 140 can each have a first side 141, an opposite second side, and lateral sides 143 that connect the first side 141 and second side to each other. The external contacts 140 can be arranged on the chip carrier 110 in such a way that the second sides face the first side 111 of the chip carrier 110.

The wing or wings 150 can be arranged on the lateral sides 143 of the external contacts 140 that are opposite the respective other external contacts 140. According to one example, both external contacts 140 can each have a wing 150 which is directly opposite the wing 150 of the respective other external contact 140. According to another example, only one of the external contacts 140 has one or more wings 150. The wing or wings 150 can be completely covered by the encapsulation body 130.

The wings 150 as described here can be in particular a widened part of the external contacts 140 which faces the respective other external contact 140. The wing or wings 150 may have any suitable shape, e.g. an oblong shape, a rectangular shape, a shape with rounded edges, a shape with pointed edges, etc.

A gap between two opposite external contacts 140 may be smaller on the wing or wings 150 than on the remaining part of the external contacts 140. Since the space between the external contacts 140 on the wing or wings 150 is filled by the dielectric encapsulation body 130, no electrical flashover occurs despite the reduced gap.

The wing or wings 150 can have any number of cutouts 160, e.g. one, two, three, . . . cutouts 160 per wing 150. All the wings 150 can have the same number of cutouts 160, or individual wings 150 can have a different number of cutouts 160. Furthermore, the cutouts of different wings 150 can all have the same position and/or the same size and/or shape or else have different positions, sizes and/or shapes.

According to one example, the cutouts 160 can extend completely through the wing or wings 150 from the first side 141 to the second side of the external contacts 140. According to another example, the cutouts 160 are only recesses that do not extend completely through the wings 150.

The cutouts 160 can make up any suitable proportion of the surface area of the respective wing 150. For example, 10% or more, 20% or more, 30% or more, 40% or more, 50% or more, 60% or more, 70% or more, 80% or more, or even 90% or more of the surface area of the respective wing 150 could be allotted to the one or more cutouts 160.

The wings 150 can be designed to reduce stray inductance in the semiconductor module 100 by routing the electrical currents in adjacent opposite-polarity external contacts 140 very closely together. This can be particularly important if the semiconductor chip 120 has SiC as the semiconductor material, as chips of this kind can be switched faster than other chips, which can lead to higher voltage overshoots. A higher stray inductance or a higher switching speed increase an overvoltage on the semiconductor chip 120 ($V=L\cdot dI/dt$), which is to be avoided.

The cutouts 160 are filled with the encapsulation material of the encapsulation body 130, which reduces the amount of metal or alloy in the wings 150. The encapsulation material of the encapsulation body 130 on one side and the metal or alloy of the external contacts 140 on the other side have different coefficients of thermal expansion. This means that temperature changes in the semiconductor module 100 can lead to mechanical stresses in the encapsulation body 130, which are particularly pronounced on the wings 150 since the external contacts 140 are particularly wide here and the different coefficient of thermal expansion is therefore particularly important. This in turn can lead to the formation of cracks in the encapsulation body or to the detachment of the encapsulation body from the external contacts 140, which negatively affects the electrical insulation and can lead to the electrical failure of the semiconductor module 100.

The fact that metal or alloy is replaced by encapsulation material in these particularly affected areas means that the difference in the coefficient of thermal expansion between encapsulation body 130 and external contacts 140 and the mechanical stresses generated by this difference can be reduced. The formation of cracks or the detachment of the encapsulation body 130 from the external contacts 140 can be prevented in this way.

Figure 2A:
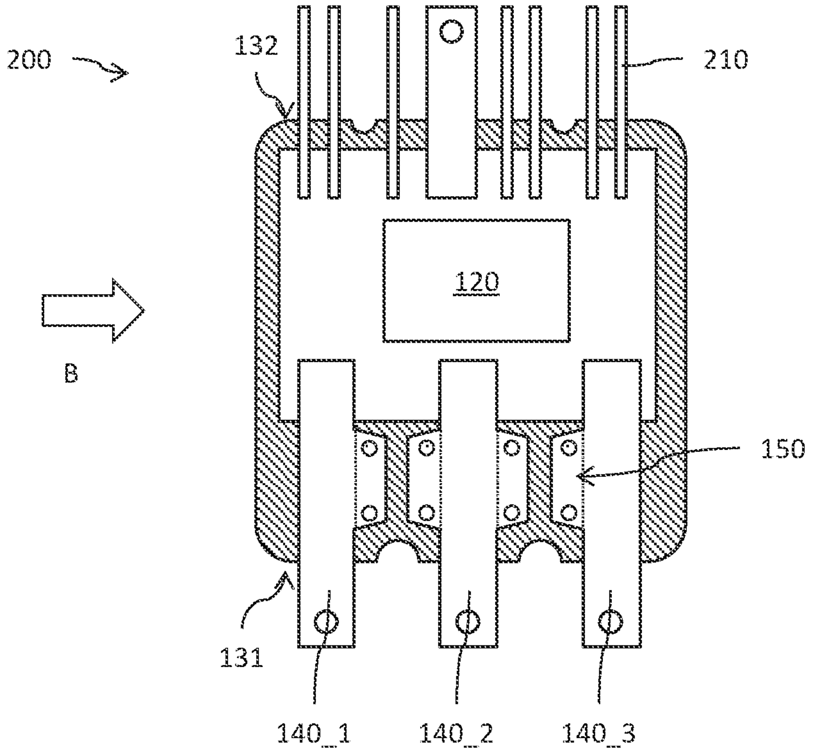
FIGS. 2A and 2B show a plan view (FIG. 2A) and a sectional view (FIG. 2B) of a further semiconductor module having external contacts with wings and cutouts, wherein the semiconductor module is designed for double-sided cooling.
Figure 2B:
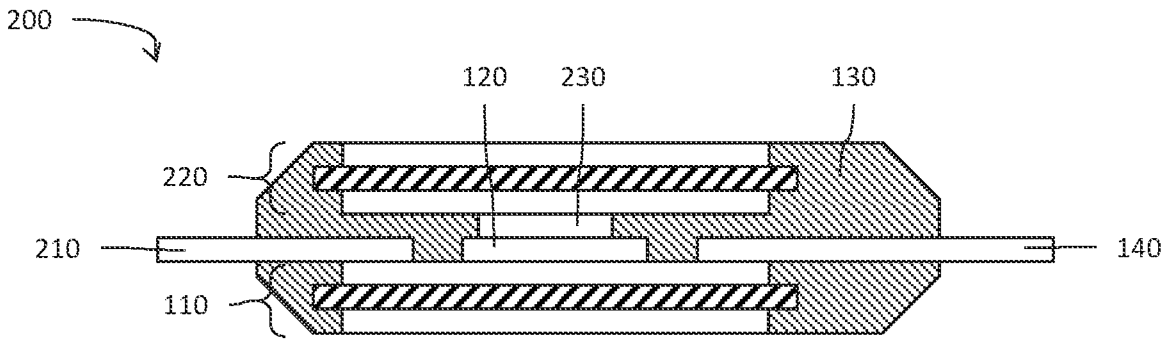

FIGS. 2A and 2B show a further semiconductor module 200, which may be similar or even identical to the semiconductor module 100, except for the differences mentioned below. FIG. 2A shows a plan view and FIG. 2B shows a side view along the arrow B in FIG. 2A.

The semiconductor module 200 has three external contacts 140_1, 140_2, and 140_3 which are uncovered by the first lateral side 131 of the encapsulation body 130. The semiconductor module 200 also comprises further external contacts 210 that are uncovered by a second lateral sides 132 of the encapsulation body 130 opposite the first lateral side 131. At least one of the other external contacts 210 can be a power contact, e.g. a phase contact.

According to one example, voltages of opposite sign can be present at the external contacts 140_1 and 140_3 on one side and the external contact 140_2 on the other, e.g. a positive voltage at the external contacts 140_1 and 140_3 and a negative voltage at the external contact 140_2, or vice versa. In this way, the wings 150 enable the stray inductance in the semiconductor module 200 to be reduced, since currents with opposite signs are routed close to each other by means of the wings 150.

According to one example, only the central external contact 140_2 has wings 150, according to another example all of the external contacts 140_1, 140_2, and 140_3 have the wings 150, as shown in FIG. 2A.

As shown in the side view of FIG. 2B, the semiconductor module 200 can comprise the chip carrier 110 and a second chip carrier 220 (the second chip carrier 220 is not shown in FIG. 2A, for the sake of clarity). For example, both chip carriers 110, 220 can be of the same type and they can be at least partially uncovered by the encapsulation body 130. According to one example, a spacer 230 can be arranged between the semiconductor chip 120 and the second chip carrier 220. The spacer 230 can be designed, for example, to electrically connect a contact on the upper side of the semiconductor chip 120 to the second chip carrier 220.

According to one example, one or more of the external contacts 140, e.g. the external contact 140_2, can be attached to the second chip carrier 220 and electrically connected to it (while the other external contacts 140, e.g. external contacts 140_1 and 140_3, are attached to the chip carrier 110 and electrically connected to it).

According to one example, the semiconductor module 200 can be designed for double-sided cooling. This means that the exposed sides of the chip carriers 110, 220 can each be attached to a heat sink.

FIGS. 3A to 3D show detail views of different examples of the wings 150, wherein the cutouts 160 in the different examples are arranged differently or have a different shape.

The wings 150 can have any suitable length l (see FIG. 3A), e.g. a length l of 0.1 mm or more, 0.5 mm or more, 1 mm or more, 1.5 mm or more, or 3 mm or more. A distance a (see FIG. 3A) between adjacent external contacts 140 at the wings 150 can be e.g. 0.8 mm or more, or 1.6 mm or more, or 2 mm or more. A width of the external contacts 140 (measured parallel to the distance a) can be increased at the wings 150 e.g. by 5% or more, or 10% or more, or 20% or more, or 40% or more, or 60% or more.

Figure 3A:
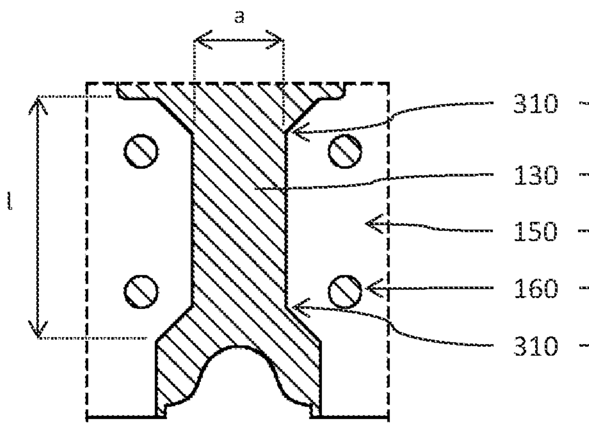
FIGS. 3A to 3D show detailed views of wings with cutouts, wherein the cutouts have different exemplary geometries.

As shown in FIG. 3A, the cutouts 160 can have a circular shape. Furthermore, the cutouts 160 can be oriented in a symmetrical arrangement on the wing 150. The wing 150 itself can have a symmetrical or almost symmetrical shape, as shown, for example, in FIGS. 3A and 3B.

Figure 3B:
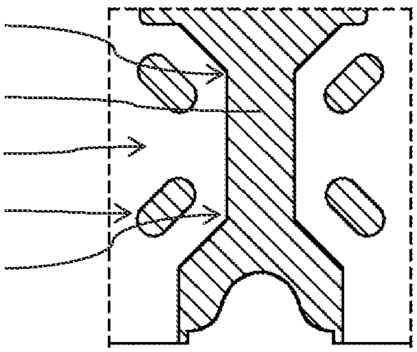

As shown in FIG. 3B, the cutouts 160 can also have an elongated shape, e.g. the shape of a rounded rectangle. Other elongated forms are also conceivable, e.g. elliptical. As also shown in FIG. 3B, a long side of the elongated cutouts 160 can extend parallel to one edge of the wing 150 on which the cutout 160 is arranged.

In FIGS. 3A and 3B, the cutouts 160 are arranged at a corner 310 or, in other words, at a vertical edge of the lateral sides of the wings 150. In this context, "arranged at a corner 310" can mean that the respective cutout 160 is arranged on the wing 150 a small distance behind the corner 310, instead of, for example, in the center of the wing 150. For example, a distance of the respective cutout 160 from the respective corner 310 can be 0.1 mm or less, or 0.5 mm or less, or 1 mm or less, or 3 mm or less, or 5 mm or less. For example, the respective cutout 160 can be arranged closer to the respective corner 310 than to a longitudinal axis of the respective external contact 140.

Figure 3C:
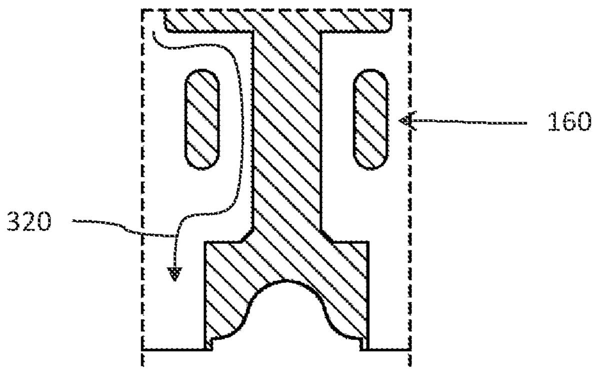

As shown in FIG. 3C, the cutouts 160 can also be arranged substantially centrally on the wings 150 instead of near the edges 310.

Figure 3D:
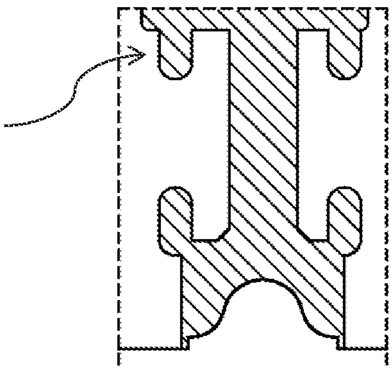

FIG. 3D shows an example according to which the cutouts 160 are not spaced apart from the lateral sides of the wings 150, but intersect them. In other words, in the example of FIG. 3D, the cutouts 160 are formed as an undercut of the respective lateral side of the wings 150.

The example shown in FIG. 3D can have the disadvantage that the cutouts 160 formed as undercuts impede a current flow through the wing 150 and thus impair the ability of the wings 150 to reduce stray inductance in the semiconductor module 100 or 200. By contrast, by arranging the cutouts 160 at a distance from the lateral sides of the wings 150, as shown e.g. in FIGS. 3A to 3C, the current flow through the wings 150 is not significantly negatively affected. This is indicated in FIG. 3C by the arrow 320 which shows that current can flow unimpeded around the cutout 160 along the lateral sides of the wing 150.

Figure 4A:
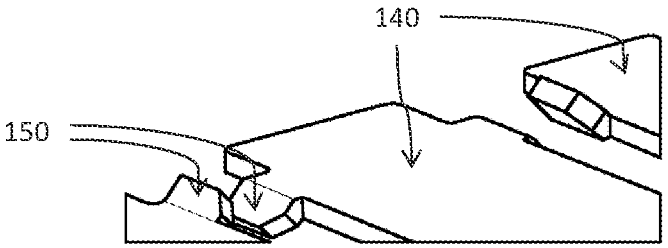
FIGS. 4A to 4C show perspective views (FIGS. 4A and 4B) and a sectional view (FIG. 4C) of external contacts, with the wings bent out of the plane of the external contacts.
Figure 4B:
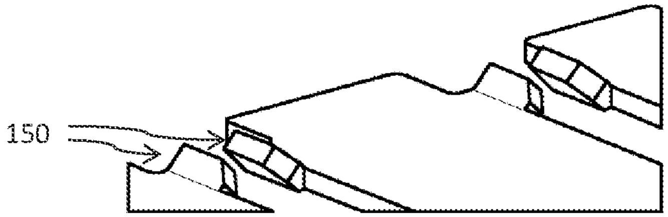
Figure 4C:
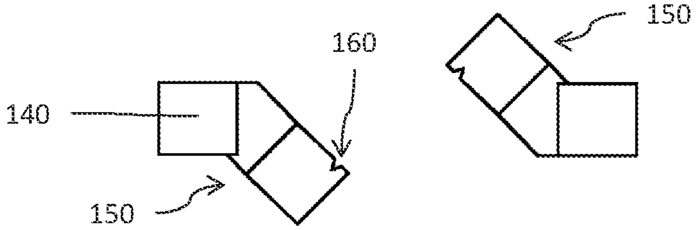

FIGS. 4A to 4C show detailed views of wings 150 according to further examples. In contrast to the wings 150 shown in FIGS. 1 to 3D, the wings 150 according to these examples do not necessarily need to comprise the cutouts 160. Instead, the external contacts 140, in particular the part of the external contacts 140 that protrudes from the encapsulation body 130, can define a plane (e.g. the plane containing the first side 141 of the external contacts 140) and the wings 150 can be bent out of this plane, as shown in FIGS. 4A to 4C.

Wings 150 bent out in this way, like the cutouts 160, can help to reduce the mechanical stress between the encapsulation body 130 and wings 150 and prevent cracks or delamination. According to one example, it is also possible for the wings 150, bent out of the plane of the first side 141 according to FIGS. 4A to 4C, to be combined with the cutouts 160 according to FIGS. 1 to 3D in order to combine these two means of reducing the mechanical stress.

As shown in FIG. 4A, according to one example, opposing wings 150 can be bent out of the plane of the first side 141 in such a way that one of these wings 150 is bent upwards and the other is bent downwards.

As shown in FIG. 4B, according to another example, opposing wings 150 can be bent out of the plane of the first side 141 in such a way that both of these wings 150 are bent upwards or downwards.

The wings 150 can be bent out of the plane of the first side 141 by any suitable angle, e.g. by 30° or more, or 45° or more, or 60° or more.

The wings 150 bent out of the plane of the first side 141 can have the cutouts 160 that are shown e.g. in FIGS. 3A to 3D. Alternatively or in addition, the wings 150 can also have cutouts 160 which run along one or more lateral sides of the wings 150. In FIG. 4C, which shows a cross-section of two wings 150, the wings 150 have cutouts 160 shaped in this way. In particular, these cutouts 160 are formed as trenches which are arranged at short distance behind a lateral edge and extend along this edge. These trenches do not extend through the wings 150, but are merely a recess in the surface of the wings 150.

The trench-shaped cutouts 160 can have e.g. a V-shaped cross-section (as shown in FIG. 4C) or a U-shaped cross-section. The trench-shaped cutouts 160 can have any suitable width and depth, e.g. a width of 0.1 mm or more, or 0.5 mm or more, or 1 mm or more and e.g. a depth of approx. 10%, 30%, 50% or 70% of the thickness of the wings 150.

According to one example, the semiconductor modules 100 and 200, in which the wings 150 are not bent, can also have the trench-shaped cutouts 160 as described here. In particular, the trench-shaped cutouts 160, as shown e.g. in FIG. 4C, can also be combined with the hole-shaped cutouts 160, as shown e.g. in FIGS. 3A to 3D.

The wings 150 and cutouts 160 described here can be produced e.g. by applying a punching or stamping process to a lead frame. The cutouts 160 can be produced in the same punching or stamping process in which the external contacts 140 (and possibly also the other external contacts 210) are produced, or they can be produced in a separate punching or stamping process which can be carried out before or after the production of the external contacts 140, 210. The cutouts can be produced in particular at a time when the external contacts 140, 210 are still connected to an outer frame of the lead frame.

Figure 5A:
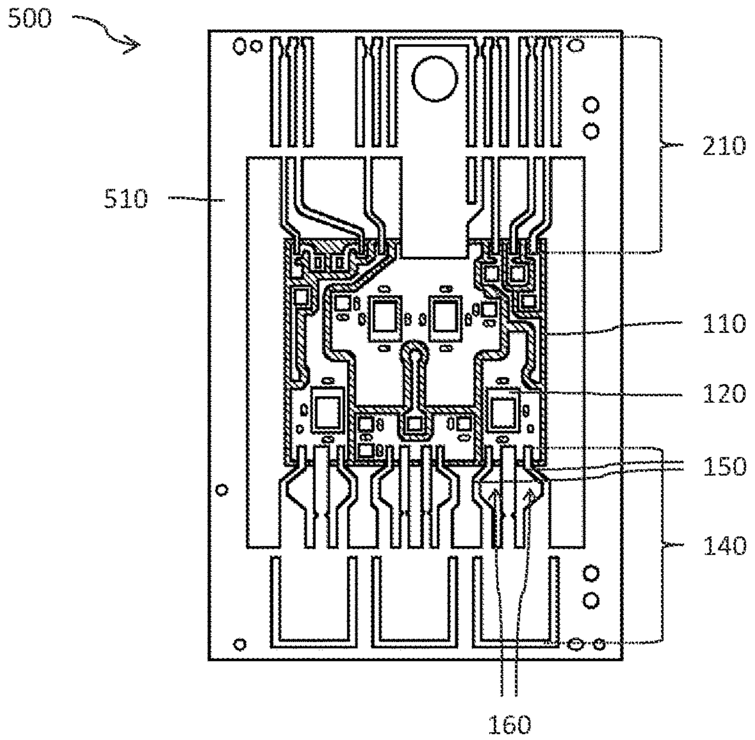
FIGS. 5A and 5B each show a plan view of further semiconductor modules, in which the cutouts are dimensioned differently.
Figure 5B:
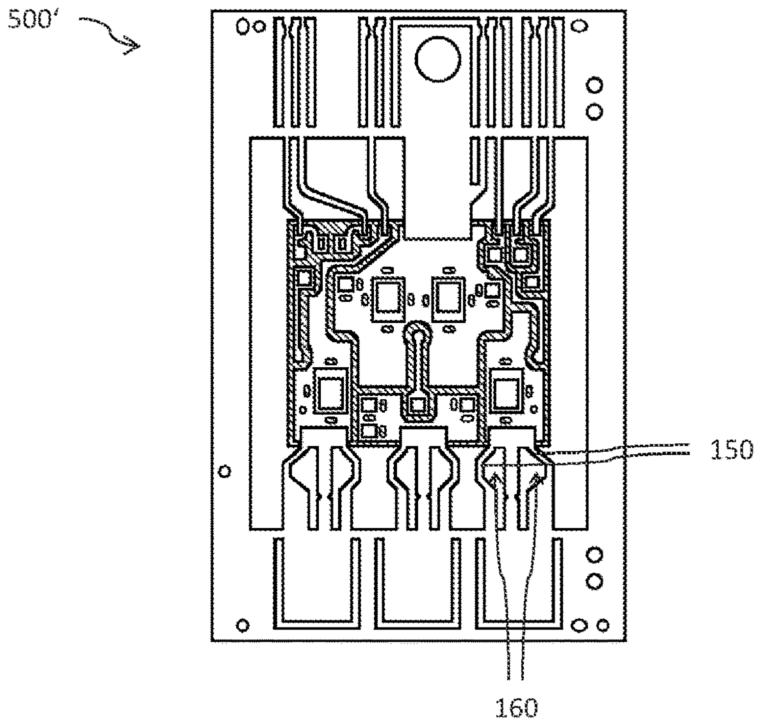

FIGS. 5A and 5B show further semiconductor modules 500 and 500', which may be similar or identical to the semiconductor modules 100 or 200, apart from the differences described below. FIGS. 5A and 5B show the semiconductor modules 500 and 500', in particular at a time when the external contacts 140, 210 are still part of a lead frame 510.

As shown in FIG. 5A, the cutouts 160 can also be designed in such a way that a wing 150 is connected to the rest of the respective external contact 140 only at one end, e.g. at the outer end. At the other end, e.g. the inner end, the wing 150 can be separated from the rest of the respective external contact 140 by the cutouts 160. This can mean that the wing (or wings) 150 and the rest of the respective external contact 140 are connected to the chip carrier 110 by separate solder joints (or welding spots or adhesive pads), as shown in FIG. 5A. It should be noted, however, that these separate solder joints or welding spots or adhesive pads are connected to the same conductive region of the chip carrier 110 (or the same contact of the semiconductor chip 120).

In the semiconductor module 500', by contrast, the cutouts 160 are designed in such a way that the wings 150 are connected at the inner end to the rest of the respective external contact 140. This means that the external contacts 140 are connected to the chip carrier 110 by a single solder joint or adhesive joint or a single welding spot in each case.

According to one example, the semiconductor modules 500 and 500' can also have the bent wings 150, as described e.g. with reference to FIGS. 4A to 4C. Furthermore, it is possible that the semiconductor modules 500 and 500' are designed for double-sided cooling and/or that one or more of the external contacts 140 are connected to a second chip carrier instead of the chip carrier 110, as described with reference to FIG. 2B.

Figure 6:
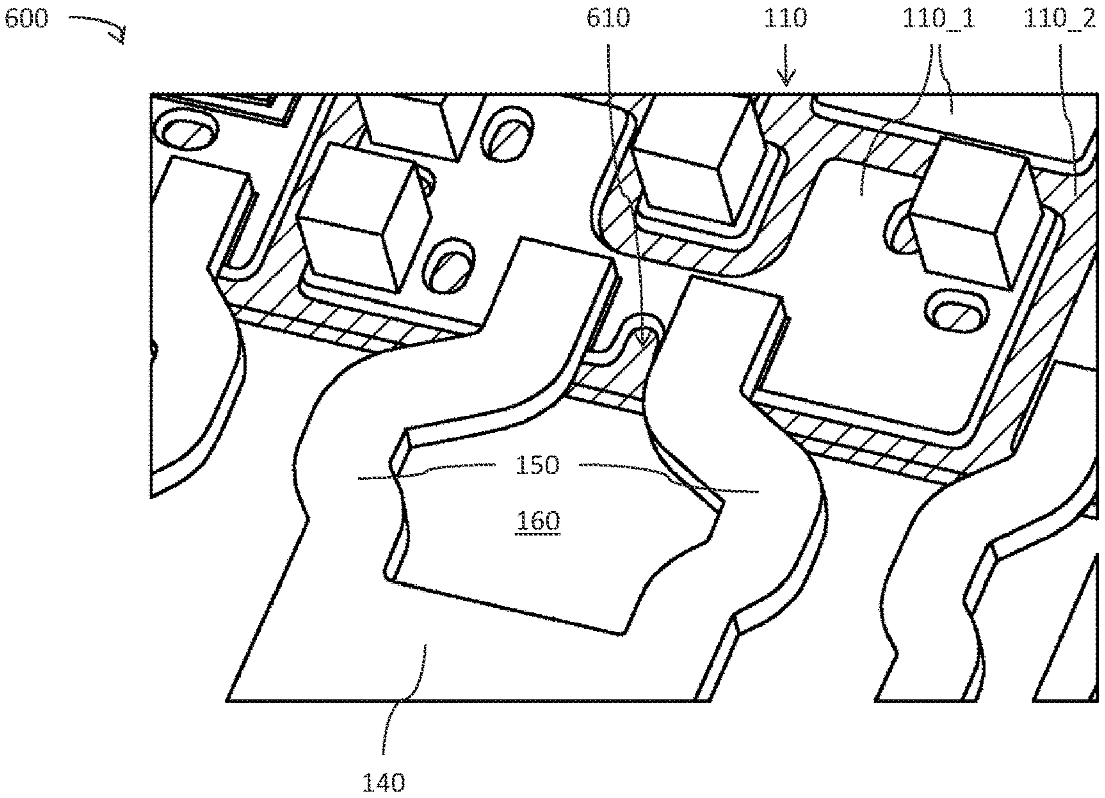
FIG. 6 shows a perspective detail view of a further semiconductor module, with a chip carrier of the semiconductor module having an optimized structure for improved solderability of external contacts.

FIG. 6 shows a perspective view of a detail of another semiconductor module 600, which may be similar or identical to the semiconductor module 500.

As shown in FIG. 6, the chip carrier 110 can comprise a structured conductive layer 110_1, wherein an external contact 140 is arranged on this conductive layer 110_1 and is electrically connected to it, e.g. by means of one or more solder joints. The conductive layer 110_1 can be arranged on a ceramic layer 110_2, for example.

The conductive layer 110_1 can have one or more gaps 610 in the region of the solder joint(s). In the region of the gaps 610, the conductive layer 110_1 is removed and the underlying ceramic layer 110_2 is exposed. The presence of such a gap 610 can, for example, simplify or optimize the production of the solder joint between the external contact 140 and the conductive layer 110_1.

FIG. 6 also shows that according to one example, an external contact 140 does not necessarily need to have a central part in the region of the cutouts 160. Instead, the external contact 140 in this region can consist of just the wings 150. In the example of FIG. 5A, however, the external contacts 140 have one or more central parts in the region of the cutouts 160.

Figure 7:
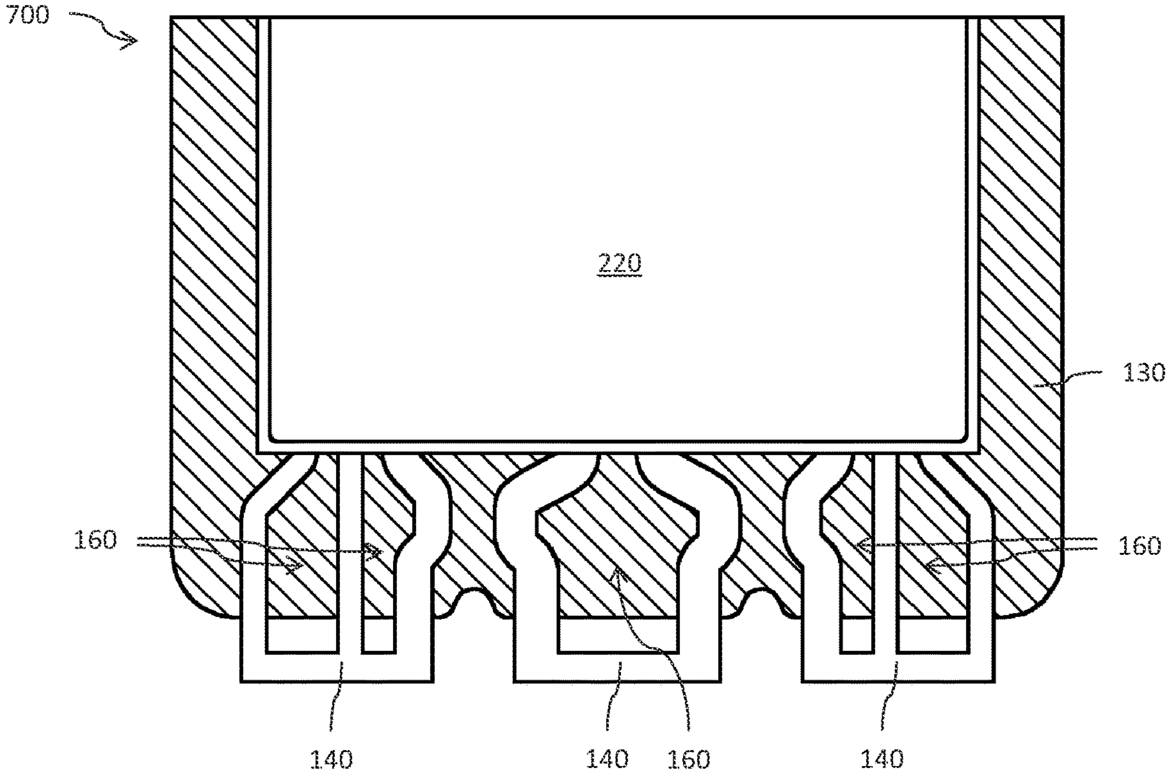
FIG. 7 shows a plan view of a further semiconductor module, in which wings of the external contacts are at least partially uncovered by the encapsulation body.

FIG. 7 shows a plan view of a detail of another semiconductor module 700, which may be similar or identical to one of the semiconductor modules 100-600 except for the differences set out below.

It has previously been shown that the wings 150 and/or the cutouts 160 of the external contacts can be arranged inside the encapsulation body 130. However, it is also possible that the wings 150 and/or the cutouts 160 are at least partially uncovered by the encapsulation body 130 or protrude from it.

Due to the fact that the wings 150 and/or cutouts 160 protrude from the encapsulation body 130, the cross-section of the external contacts 140 at the outer surface of the encapsulation body 130 is smaller than if the wings 150 or cutouts 160 were completely arranged in the encapsulation body 130. This in turn can help to reduce the lever forces exerted by the external contacts 140 on the encapsulation body 130, thus reducing the formation of cracks in the encapsulation body 130, for example.

Furthermore, in the example of FIG. 7 it is shown that different wings 150, in particular also different wings 150 of the same external contact 140, can have different widths. For example, a wing 150 of an external contact 140 that is located directly opposite a wing 150 of another external contact 140 can have a larger width than other wings 150. The width of the wings 150, in particular the increased width of such opposing wings 150, can be designed to improve the current flow in the semiconductor module 700 and/or reduce stray inductances at the external contacts 140.

In the following, the semiconductor modules with external contacts that comprise wings are explained in more detail using specific examples.

Example 1 is a semiconductor module comprising: a chip carrier having a first side and a second, opposite side, a semiconductor chip arranged on the first side of the chip carrier, an encapsulation body that encapsulates the semiconductor chip, and at least two external contacts made of a metal or an alloy and arranged next to each other, which are electrically and mechanically connected to the first side of the chip carrier and protrude laterally from the encapsulation body, wherein at least one of the external contacts has at least one wing arranged within the encapsulation body and located opposite the other external contact, and wherein the wing comprises one or more cutouts that are filled with the encapsulation material of the encapsulation body.

Example 2 is the semiconductor module according to example 1, wherein each external contact comprises a first side and a second, opposite side and lateral sides that connect the first and second side to each other, wherein the first and second side extend parallel to the first and second side of the chip carrier, and wherein the one or more cutouts extend from the first side to the second side.

Example 3 is the semiconductor module according to example 2, wherein the one or more cutouts are arranged on vertical edges of the lateral sides of the wing, wherein the vertical edges are perpendicular to the first and second side of the external contacts.

Example 4 is the semiconductor module according to example 2 or 3, wherein the one or more cutouts are spaced apart from the lateral sides of the wing.

Example 5 is the semiconductor module according to example 4, wherein the one or more cutouts have an elongated outline, viewed from above the first side, and wherein a longitudinal axis of the outline runs parallel to a respective lateral side of the wing.

Example 6 is the semiconductor module according to example 2 or 3, wherein the one or more cutouts are formed as an undercut of the respective lateral sides.

Example 7 is the semiconductor module according to one of the examples 2 to 6, wherein the one or more cutouts are each less than 1.5 mm away from one of the lateral sides of the wing.

Example 8 is the semiconductor module according to one of the previous examples, wherein one or more cutouts each have a rounded outline.

Example 9 is the semiconductor module according to one of the previous examples, wherein a proportion of a surface area of the wing allotted to the one or more recesses is in a range from 10% to 90%, in particular in a range from 20% to 80%, more particularly in a range from 30% to 70%.

Example 10 is the semiconductor module according to one of the previous examples, wherein the wing comprises at least two cutouts in a symmetrical arrangement.

Example 11 is a semiconductor module comprising: a chip carrier having a first side and a second, opposite side, a semiconductor chip arranged on the first side of the chip carrier, an encapsulation body that encapsulates the semiconductor chip, and at least two external contacts made of a metal or an alloy and arranged next to each other, which are electrically and mechanically connected to the first side of the chip carrier and protrude laterally from the encapsulation body, wherein at least one of the external contacts has at least one wing arranged within the encapsulation body and located opposite the other external contact, wherein the external contact parts protruding from the encapsulation body define a common plane, and wherein the wing is bent out of this plane.

Example 12 is the semiconductor module according to example 11, wherein at least two of the external contacts comprise wings which are opposite each other and which are bent out of the common plane in such a way that one of these wings is bent upwards and the other is bent downwards.

Example 13 is the semiconductor module according to example 11, wherein at least two of the external contacts comprise wings which are opposite each other and which are bent out of the common plane in such a way that both wings are bent upwards or both wings are bent downwards.

Example 14 is the semiconductor module according to one of the examples 11 to 13, wherein the wing or wings comprises/comprise one or more cutouts, which are filled with the encapsulation material of the encapsulation body.

Example 15 is the semiconductor module according to example 14, wherein the one or more cutouts are trenches that run along one or more edges of the wing or wings.

Example 16 is the semiconductor module according to example 15, wherein the trenches have a V-shaped or a U-shaped cross-section.

Example 17 is the semiconductor module according to example 14, wherein the one or more cutouts are holes which extend through the wing or wings.

Example 18 is the semiconductor module according to one of the examples 11 to 17, wherein the wing or wings are bent out of the common plane by at least 30°.

Example 19 is a semiconductor module comprising: a first chip carrier having a first side and a second, opposite side and a second chip carrier having a first and a second, opposite side, wherein the first sides of the first and second chip carriers are facing each other, a semiconductor chip arranged between the first sides of the first and second chip carriers and arranged on the first side of the first chip carrier, an encapsulation body that encapsulates the semiconductor chip, and at least two external contacts made of a metal or an alloy and arranged next to each other, wherein one of the external contacts is electrically and mechanically connected to the first side of the first chip carrier and another of the external contacts is electrically and mechanically connected to the first side of the second chip carrier and wherein the external contacts protrude laterally from the encapsulation body, wherein at least one of the external contacts has at least one wing arranged within the encapsulation body and located opposite another of the external contacts, and wherein the wing comprises one or more cutouts that are filled with the encapsulation material of the encapsulation body.

Example 20 is a semiconductor module according to one of the previous examples, wherein the wing is at least partially uncovered by the encapsulation body.

Although specific embodiments have been shown and described herein, it is obvious to the person of average skill in the art that a plurality of alternative and/or equivalent implementations can replace the specific examples shown and described, without departing from the scope of the present disclosure. This application is intended to include all modifications or variations of the specific examples discussed herein. It is therefore intended that this disclosure is limited only by the claims and their equivalents.

What is claimed is:

1. A semiconductor module, comprising:
- a chip carrier having a first side and a second, opposite side;
- a semiconductor chip arranged on the first side of the chip carrier;
- an encapsulation body that encapsulates the semiconductor chip; and
- at least two external contacts made of a metal or an alloy and arranged next to each other, which are electrically and mechanically connected to the first side of the chip carrier and protrude laterally out of the encapsulation body,
- wherein at least one of the external contacts has at least one wing arranged within the encapsulation body and located opposite the other external contact, and
- wherein the at least one wing comprises one or more cutouts that are filled with the encapsulation material of the encapsulation body.

2. The semiconductor module of claim 1, wherein each external contact comprises a first side and a second, opposite side and lateral sides that connect the first and second side to each other, wherein the first and second side extend parallel to the first and second side of the chip carrier, and wherein one or more cutouts extend from the first side to the second side.

3. The semiconductor module of claim 2, wherein the one or more cutouts are arranged on vertical edges of the lateral sides of the at least one wing, and wherein the vertical edges are perpendicular to the first and second side of the external contacts.

4. The semiconductor module of claim 2, wherein the one or more cutouts are spaced apart from the lateral sides of the at least one wing.

5. The semiconductor module of claim 4, wherein the one or more cutouts have an elongated outline, viewed from above the first side, and wherein a longitudinal axis of the outline runs parallel to a respective lateral side of the at least one wing.

6. The semiconductor module of claim 2, wherein the one or more cutouts are formed as an undercut of the respective lateral sides.

7. The semiconductor module of claim 2, wherein the one or more cutouts are each less than 1.5 mm away from one of the lateral sides of the at least one wing.

8. The semiconductor module of claim 1, wherein the one or more cutouts each have a rounded outline.

9. The semiconductor module of claim 1, wherein a proportion of a surface area of the at least one wing allotted to the one or more cutouts is in a range from 10% to 90%.

10. The semiconductor module of claim 1, wherein the at least one wing comprises at least two cutouts in a symmetrical arrangement.

11. A semiconductor module, comprising:
- a chip carrier having a first side and a second, opposite side;
- a semiconductor chip arranged on the first side of the chip carrier;
- an encapsulation body that encapsulates the semiconductor chip; and
- at least two external contacts made of a metal or an alloy and arranged next to each other, which are electrically and mechanically connected to the first side of the chip carrier and protrude laterally out of the encapsulation body,
- wherein at least one of the external contacts has at least one wing arranged within the encapsulation body and located opposite the other external contact,
- wherein the external contacts protruding from the encapsulation body define a common plane, and
- wherein the at least one wing is bent out of the common plane.

12. The semiconductor module of claim 11, wherein at least two of the external contacts comprise wings which are opposite each other and which are bent out of the common plane in such a way that one of the wings is bent upwards and another one of the wings is bent downwards.

13. The semiconductor module of claim 11, wherein at least two of the external contacts comprise wings which are opposite each other and which are bent out of the common plane in such a way that each of the wings are bent upwards or downwards.

14. The semiconductor module of claim 11, wherein the at least one wing comprises one or more cutouts, which are filled with encapsulation material of the encapsulation body.

15. The semiconductor module of claim 14, wherein the one or more cutouts are trenches which extend along one or more edges of the at least one wing.

16. The semiconductor module of claim 15, wherein the trenches have a V-shaped or a U-shaped cross-section.

17. The semiconductor module of claim 14, wherein the one or more cutouts are holes which extend through the at least one wing.

18. The semiconductor module of claim 11, wherein the at least one wing is bent out of the common plane by at least 30°.

19. A semiconductor module, comprising:
- a first chip carrier having a first side and a second, opposite side;
- a second chip carrier having a first side and a second, opposite side, wherein the first sides of the first and second chip carriers are facing each other;
  - a semiconductor chip arranged between the first sides of the first and second chip carriers and arranged on the first side of the first chip carrier;
  - an encapsulation body that encapsulates the semiconductor chip; and
  - at least two external contacts made of a metal or an alloy and arranged next to each other, wherein one of the external contacts is electrically and mechanically connected to the first side of the first chip carrier and another of the external contacts is electrically and mechanically connected to the first side of the second chip carrier, wherein the external contacts protrude laterally out of the encapsulation body, wherein at least one of the external contacts has at least one wing arranged within the encapsulation body and located opposite another of the external contacts, and wherein the at least one wing comprises one or more cutouts that are filled with the encapsulation material of the encapsulation body.

20. The semiconductor module of claim 19, wherein the at least one wing is at least partially uncovered by the encapsulation body.

* * * * *